United States Patent
Lee et al.

(10) Patent No.: US 8,563,437 B2
(45) Date of Patent: *Oct. 22, 2013

(54) METHOD FOR TREATING GROUP III NITRIDE SEMICONDUCTOR

(75) Inventors: Wei-I Lee, Hsinchu (TW); Ying-Chia Hsu, New Taipei (TW); Yen-Hsien Yeh, New Taipei (TW); Kuei-Ming Chen, New Taipei (TW)

(73) Assignee: National Chiao Tung University, Hsinchu (TW)

( * ) Notice: Subject to any disclaimer, the term of this patent is extended or adjusted under 35 U.S.C. 154(b) by 229 days.

This patent is subject to a terminal disclaimer.

(21) Appl. No.: 13/064,284

(22) Filed: Mar. 16, 2011

(65) Prior Publication Data

US 2012/0052691 A1 Mar. 1, 2012

(30) Foreign Application Priority Data

Sep. 1, 2010 (TW) ................................ 99129442 A (51) Int. Cl.
*H01L 21/302* (2006.01)
*H01L 21/461* (2006.01)

(52) U.S. Cl.
USPC ............ 438/704; 438/706; 438/734; 438/745

(58) Field of Classification Search
None
See application file for complete search history.

(56) References Cited

U.S. PATENT DOCUMENTS

| 6,238,947 B1 * | 5/2001 | Shakuda ......................... 438/94 |
| 8,420,543 B1 * | 4/2013 | Lee et al. ...................... 438/704 |
| 2005/0194634 A1 * | 9/2005 | Ishikawa et al. .............. 257/324 |
| 2006/0186426 A1 * | 8/2006 | Nunoue et al. .................. 257/98 |

OTHER PUBLICATIONS

Yeh et al, Yen-Hsien, Hydrogen etching on the surface of GaN for producing patterned structures, Journal of Crystal Growth, Elsevier B.V., Oct. 23, 2010.
Yeh et al, Yen-Hsien, Hydrogen etch of GaN and its application to produce porous GaN, published: (International meeting in San Francisco) Photonic West 2011, (oral report and thesis), Jan. 25, 2011, Conference 7939, Gallium Nitride Materials and Devices VI, Session 6: Advanced Techniques II.
Yeh et al, Yen-Hsien, Effect of hydrogen etching on the surface of GaN for producing porous cave structure, published: (Annual Physics Meeting in Republic of China)(date: Jan. 25, 2011, National Normal University, Kong Kuan Campus/thesis on the wall, poster number:BP-152).
Hsu, Ying-Chia (Graduate student), Lee, Wei-I (Advisor), The Effects of Hydrogen Treatment on GaN Surface, An Oral Examination Publication/Thesis for Master Degree, Submitted to department of Electrophysics, Graduate School of Science, National Chiao Tung University, Date of publication: Jul. 28, 2010.

* cited by examiner

*Primary Examiner* — Duy Deo
(74) *Attorney, Agent, or Firm* — Bacon & Thomas, PLLC (57) ABSTRACT

The invention discloses a treating method to produce various patterns on the surface by using gases with ability to etch the group III nitride semiconductor in certain conditions. The selective etching makes some specific patterns on group III nitride semiconductor surface, and different forms of the patterns can be controlled by the selective etching conditions.

10 Claims, 13 Drawing Sheets

METHOD FOR TREATING GROUP III NITRIDE SEMICONDUCTOR

BACKGROUND OF THE INVENTION

1. Field of the Invention

The invention relates to a surface treating method, particularly to a method for treating the group III nitride semiconductor.

2. Description of the Prior Art

In the conventional semiconductor manufacturing process technology, the heterogeneous epitaxy method is often adopted to form the nitride semiconductor thin film or the nitride semiconductor thick film. It means to form the nitride semiconductor thin film (or thick film) on the non-nitride semiconductor substrate, such as the sapphire substrate. However, due to the difference of lattice constant exists between the non-nitride semiconductor substrate and the nitride semiconductor, thus 15% of lattice mismatch will be generated, and the defects of threading dislocations will be produced. These defects will influence the photoelectric characteristics of the light emitting diode (LED). Not only the power will be wasted, but also the surplus heat will be produced. If the conventional technology is employed to form the patterns on the nitride semiconductor, the method will be quite complicated actually.

As for the method to reduce the above-mentioned defects of threading dislocations at present, the Void-Assisted Separation (VAS), the Facet-Controlled Epitaxial Lateral Overgrowth (FACELO), and the Epitaxial lateral overgrowth (ELOG) are used to reduce the number of threading dislocations, and in order to reduce the defect density. However, the above-mentioned technologies need additional the semiconductor manufacturing processes, such as the photolithography process, and the dry etching process etc. These additional semiconductor manufacturing processes will increase the manufacturing cost.

In one of the prior art, such as Taiwan Patent No. 1271788, the GaN single chip substrate, the nitride semiconductor substrate, the nitride semiconductor device and the manufacturing method had been proposed. This patent discusses the GaN after grinding mainly. The scratches on surface can be annealed by ammonia+hydrogen ($NH_3+H_2$) to obtain smooth surface. The ammonia ($NH_3$) also can provide hydrogen atom (H), but the total amount is insufficient, thus it is necessary to add hydrogen ($H_2$) for the supplementation. The ammonia is the main gas, and the hydrogen gas is the auxiliary gas. The effect is to smoothen the surface, which is a result of the surface atom migration.

In another prior art, such as U.S. Pat. No. 5,814,239 about Gas-Phase Etching and Regrowth Method for Group 111—Nitride Crystals, the gas is used to etch group III nitride semiconductor surface mainly. The gas may be halogen gas (Such as $F_2$, $Cl_2$, $Br_2$ and $I_2$) or hydrogen halide gas (Such as HF, HCl, HBr and HI). The pressure is at 1 atm, and the temperature is 500° C.~900° C. The smooth group III nitride semiconductor surface is able be obtained under the condition, but the patterns are unable to be obtained on the group III nitride semiconductor surface.

Therefore, in order to make some specific patterns on the group III nitride semiconductor surface, providing the better semiconductor production technology to the industry, it is necessary to research and develop innovative semiconductor manufacturing process, in order to raise the production efficiency and reduce the manufacturing cost.

SUMMARY OF THE INVENTION

The invention relates a method for treating the group III nitride semiconductor. The selective etching gas is used to make some specific patterns on the group III nitride semiconductor surface under the certain temperature and the certain pressure.

The invention relates to a method for treating the group III nitride semiconductor, which comprises the following steps:

Firstly, the method provides the group III nitride semiconductor; raises to the certain temperature; maintain at that temperature; introduce the selective etching gas and maintain at the certain pressure; maintain for the certain time to etch the group III nitride semiconductor; stop the introduction of the specific etching gas and reduce the temperature, in order to form the etched group III nitride semiconductor.

The invention can use the gas (such as hydrogen) to etch the group III nitride semiconductor in a single epitaxy machine, in order to form the patterns on the group III nitride semiconductor surface and reduce the manufacturing cost significantly.

After the treatment the patterned group III nitride semiconductor produced by the invention can reduce the defect density of epatixy layer, release the stress, and produce the self-separation effect when the thick epatixy layer is generated.

As for the technological characteristics of the invention, there are simple and less steps, which can be finished in a single machine without additional semiconductor manufacturing steps, thus the manufacturing cost can be reduced.

As for the technological characteristics of the invention, due to there are many variations of patterns, the defect density and internal stress can be reduced in the semiconductor.

Therefore, the advantage and spirit of the invention can be understood further by the following detail description of embodiments and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The invention relates a method for treating the group III nitride semiconductor layer by an etching method. The etching gas such as hydrogen is used to treat the group III nitride semiconductor surface at the high temperature. Different patterns can be formed on the group III nitride semiconductor surface in the certain conditions. It is also called a method for treating the group III nitride semiconductor. The invention embodiments are described as follows:

First Embodiment

Heat the GaN template grown by Metal-organic Chemical Vapor Deposition (MOCVD) in the Hydride Vapor Phase Epitaxy (HVPE) reactor. When the temperature reaches about 1100° C. to 1000° C. (1050° C. is preferred and maintained at 1050° C.), introduce 3.95 standard liters per minute (slm) of nitrogen and 1.95 slm of hydrogen into the HVPE reactor. The pressure is maintained at about 750 torr to 650 torr (700 torr is preferred). The reaction time is about 5 minutes to 15 minutes (10 minutes is preferred). When the time is up, stop to supply hydrogen gas and reduce the temperature, the pattern shown in FIG. 1 will be formed on GaN surface.

Figure 1:
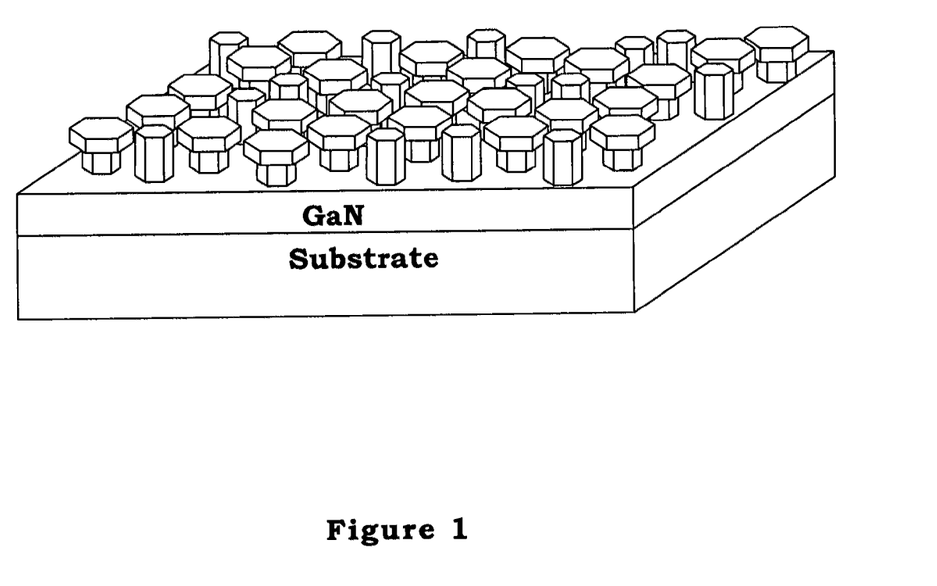
FIG. 1 is a graph illustrating the patterns for the first embodiment of the invention.

FIG. 1 shows the pattern etched by the invention. The surface pattern of GaN is caused by the etching of hydrogen. The nitrogen is only used as the environmental gas in the invention. Other inert gases are able to be used, such as argon, helium etc. Even when some equipments are used, only the etching gas is required without using other environmental gas.

The hydrogen can make GaN to form pattern shown in FIG. 1, mainly because the main function of the hydrogen can promote the decomposition of GaN. After the decomposition of GaN, the hydrogen atom and nitrogen atom are combined $NH_3$ or other gaseous N—H compound and the gallium atom is left to move on the surface. The high temperature will also help the gallium atom to escape from the surface. There is different plane polarity for the lattice of GaN. The GaN template grown by the MOCVD has Ga-polarity on c-plane. The N-polarity is formed near the substrate. The vertical plane has nonpolar a-plane and m-plane. The inclined plane has N-polarity on (1-101) and (11-22) mainly. In these planes with different polarity, due to the hydrogen etching will remove the nitrogen atoms mainly, the plane with more nitrogen atoms will be relatively unstable, thus the plane with Ga-polarity becomes the most steady state, and the nonpolar plane with a half nitrogen atom and a half gallium atom is stable. The inclined plane (1-101) and (11-22) with more nitrogen atoms will become unstable, and the back plane with N-polarity will be the most unstable plane.

FIG. 2A to FIG. 2E show the patterns formed on the nitride surface by the invention.

Figure 2A:
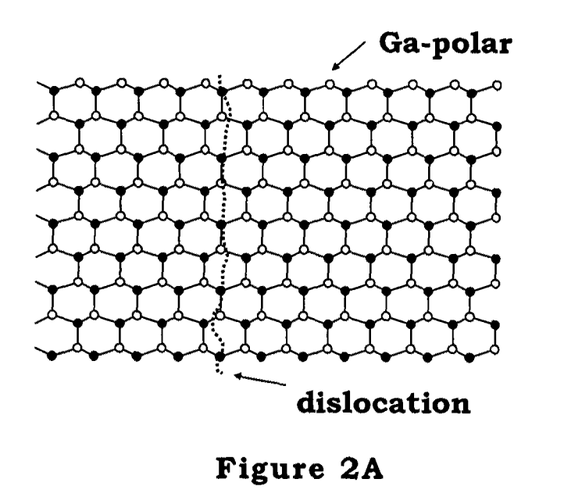
FIG. 2A to FIG. 2E show the processes for the patterns formed on the nitride surface by the invention.

As shown in FIG. 2A, when the hydrogen gas reaches to the GaN surface at the high temperature, due to the Ga-polar surface is relatively stable, so it is difficult to be decomposed.

Figure 2B:
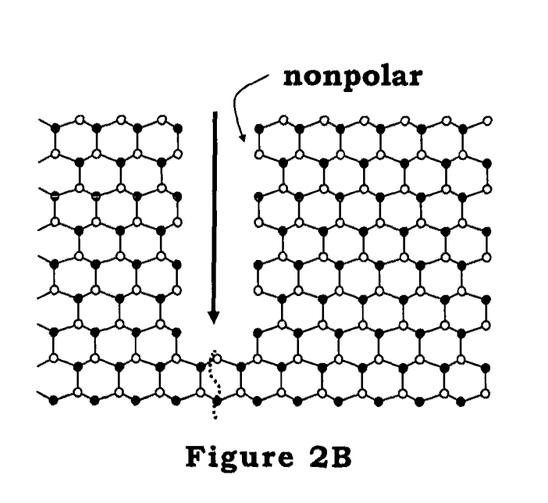

As shown in FIG. 2B, the hydrogen gas starts to etch the weaker area, such as the dislocation area (the dashed line shown in FIG. 2A), in order to become the vertical etching.

Figure 2C:
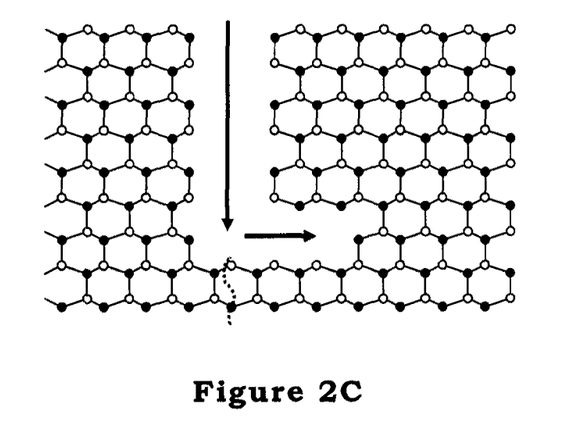

As shown in FIG. 2C, the nitrogen atoms are generated by decomposition during the etching process. These decomposed nitrogen atoms make the nonpolar plane unstable. Thus, after the hydrogen gas reaches to a certain depth, it begins to carry out the horizontal etching and generates the transverse etching as shown in the Figure.

Figure 2D:
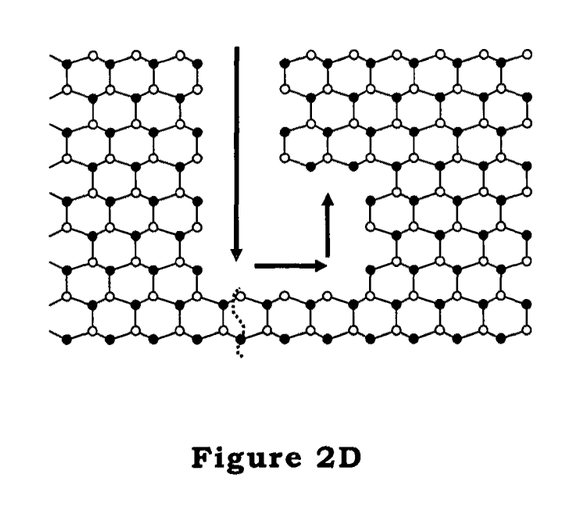

As shown in FIG. 2D, after the side plane is etched, the plane with N-polarity is exposed at back side. Due to the plane is easier to be etched, thus the hydrogen gas begins to etch from bottom to top vertically.

Figure 2E:
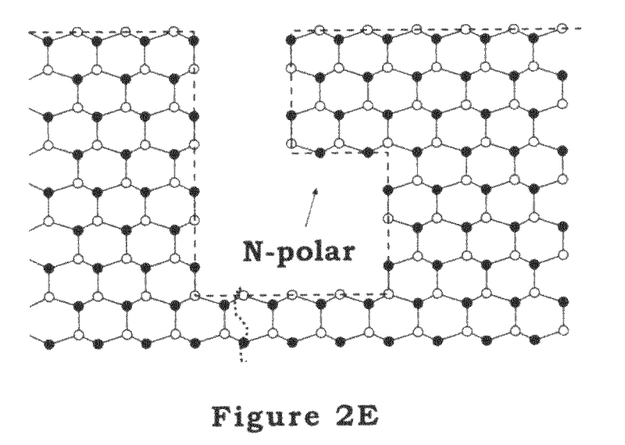

As shown in FIG. 2E, the final etched patterns are illustrated. After these straight, T shape and F shape columns are combined, the patterns shown in FIG. 1 will be formed.

Figure 3:
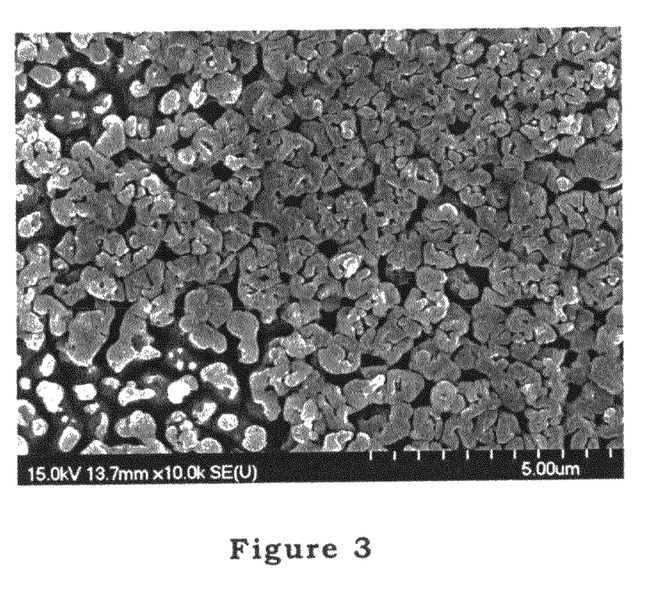
FIG. 3 shows the top view for the patterns of the first embodiment by the scanning electron microscope.
Figure 4:
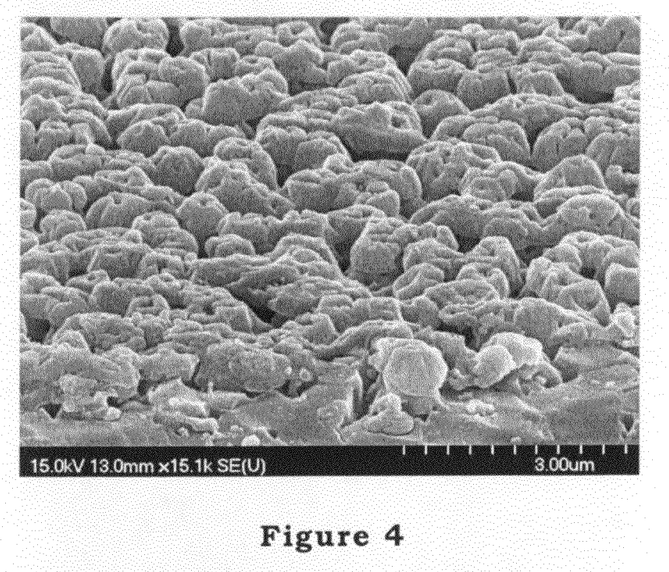
FIG. 4 shows the oblique view for the patterns of the first embodiment by the scanning electron microscope.
Figure 5:
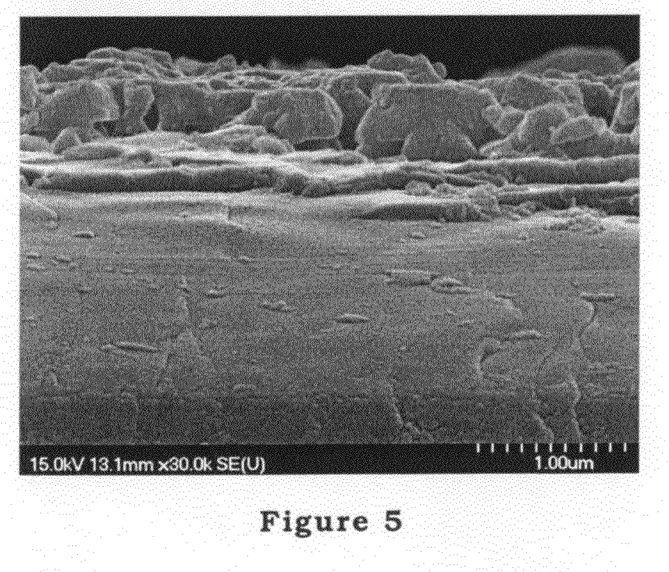
FIG. 5 shows the side view for the patterns of the first embodiment by the scanning electron microscope.

As shown in FIG. 3, FIG. 4, and FIG. 5, the top view, the oblique view, and the side view for the patterns of the first embodiment are illustrated by the scanning electron microscope (SEM), respectively.

Second Embodiment

Heat the GaN template grown by Metal-organic Chemical Vapor Deposition (MOCVD) in the Hydride Vapor Phase Epitaxy (HVPE) reactor. When the temperature reaches about 1150° C. to 1050° C. (1100° C. is preferred and maintained at 1100° C.), introduce 3.95 standard liters per minute (slm) of hydrogen into the HVPE reactor. The pressure is maintained at about 750 torr to 650 torr (700 torr is preferred). The reaction time is about 5 minutes to 15 minutes (10 minutes is preferred). When the time is up, stop to supply hydrogen gas and reduce the temperature, the pattern shown in FIG. 1 will be formed on GaN surface. However, the etching depth and column size will be different from the results of the first embodiment.

Figure 6:
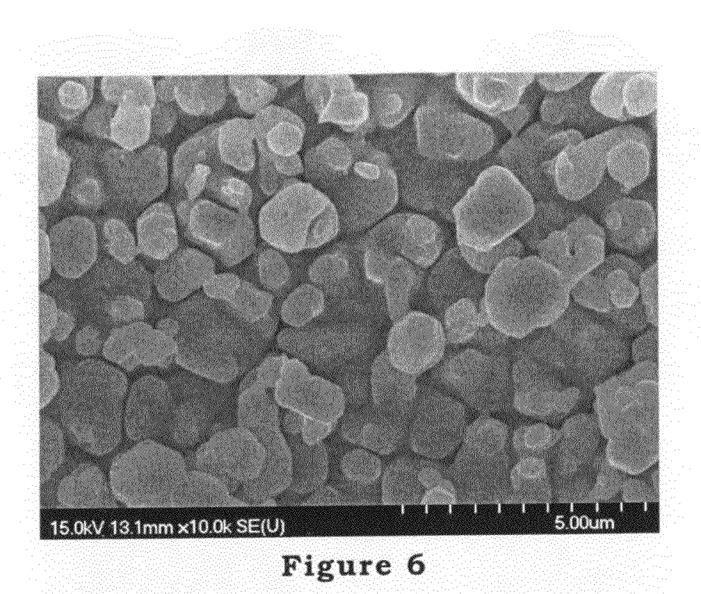
FIG. 6 shows the top view for the patterns of the second embodiment by the scanning electron microscope.
Figure 7:
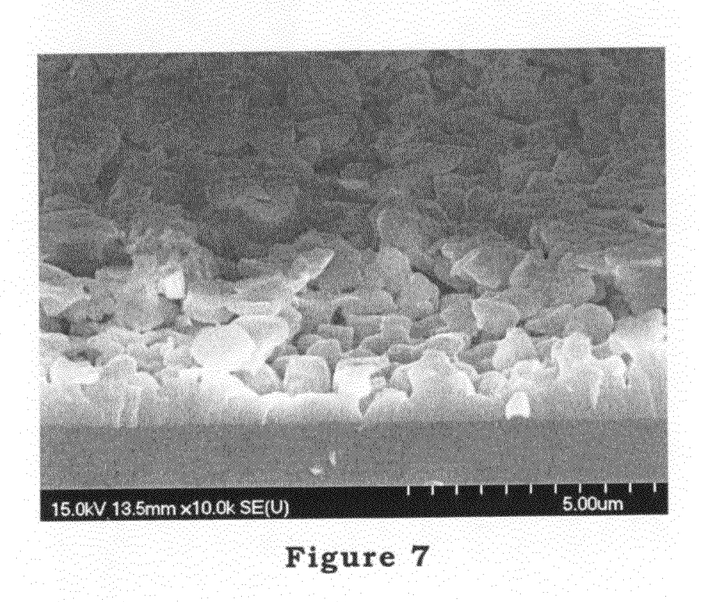
FIG. 7 shows the oblique view for the patterns of the second embodiment by the scanning electron microscope.
Figure 8:
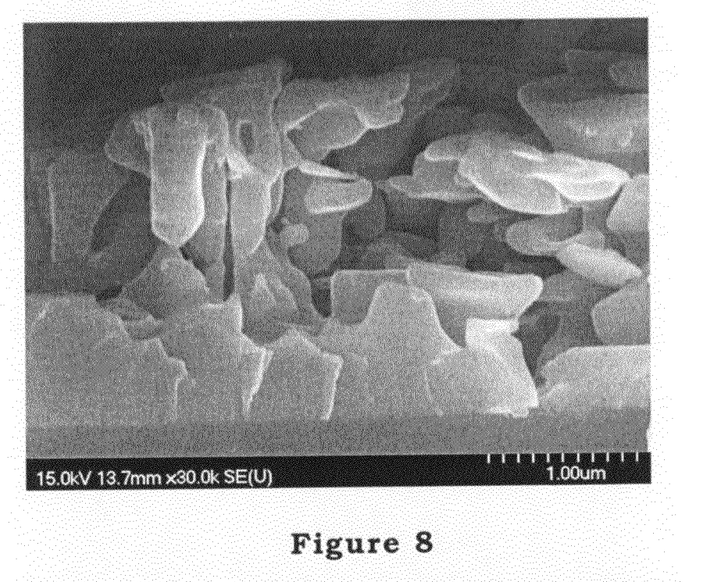
FIG. 8 shows the side view for the patterns of the second embodiment by the scanning electron microscope.

As shown in FIG. 6, FIG. 7, and FIG. 8, the top view, the oblique view, and the side view for the patterns of the second embodiment are illustrated by the scanning electron microscope (SEM), respectively.

Third Embodiment

Figure 9:
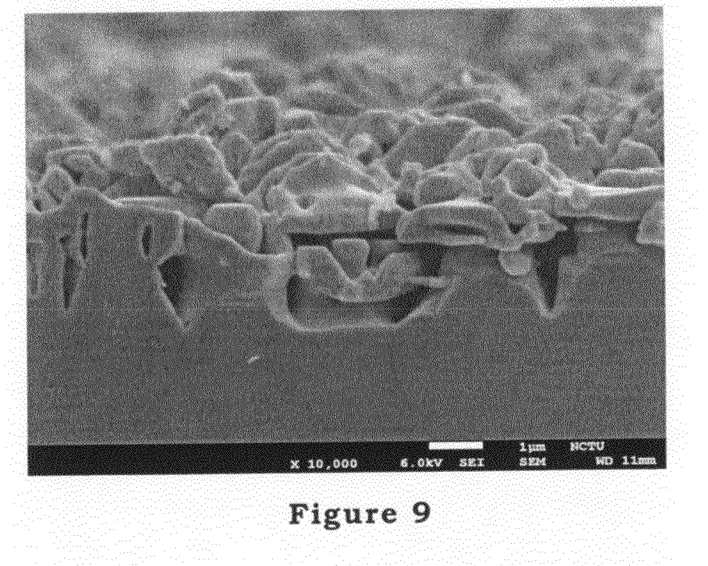
FIG. 9 shows the side view for the patterns of the third embodiment by the scanning electron microscope.

Heat the free-standing GaN substrate in the Hydride Vapor Phase Epitaxy (HVPE) reactor. When the temperature reaches about 1150° C. to 1050° C. (1100° C. is preferred and maintained at 1100° C.), introduce 5.9 standard liters per minute (slm) of hydrogen into the HVPE reactor. The pressure is maintained at about 750 torr to 650 torr (700 torr is preferred). The reaction time is about 25 minutes to 35 minutes (30 minutes is preferred). When the time is up, stop to supply hydrogen gas and reduce the temperature, the pattern shown in FIG. 1 will be formed on GaN surface. However, the etching depth and column size will be different from the results of the first embodiment and second embodiment. FIG. 9 shows the side view for the patterns of the third embodiment by the scanning electron microscope (SEM).

Fourth Embodiment

Heat the GaN template grown by Metal-organic Chemical Vapor Deposition (MOCVD) in the Hydride Vapor Phase Epitaxy (HVPE) reactor. When the temperature reaches about 1100° C. to 1000° C. (1050° C. is preferred and maintained at 1050° C.), introduce 4.9 standard liters per minute (slm) of nitrogen and 1.0 slm of hydrogen into the HVPE reactor. The pressure is maintained at about 450 torr to 350 torr (400 torr is preferred). The reaction time is about 5 minutes to 15 minutes (10 minutes is preferred). When the time is up, stop to supply hydrogen gas and reduce the temperature, the pattern shown in FIG. 10 will be formed on GaN surface.

Figure 10:
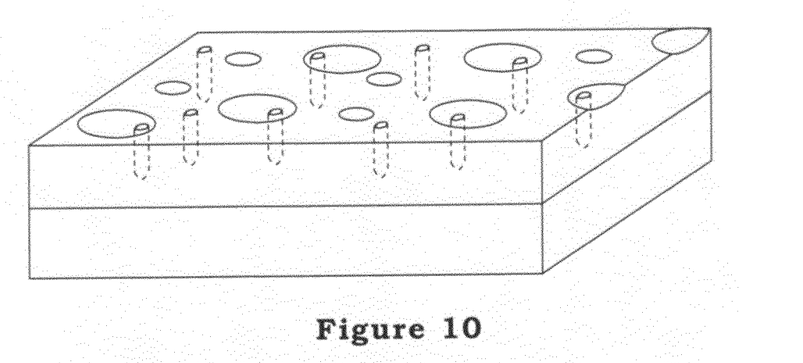
FIG. 10 is a graph illustrating the patterns for the fourth embodiment of the invention.

The reason for the generation of this pattern is, when the pressure is reduced, there will be lesser nitrogen atoms due to the slower etching speed. Thus the nonpolar plane becomes comparatively stable. The deeper etched pits will be appeared at this moment. This kind of pattern will be much different from the pattern generated at high pressure in the first embodiment, second embodiment, and third embodiment.

Figure 11:
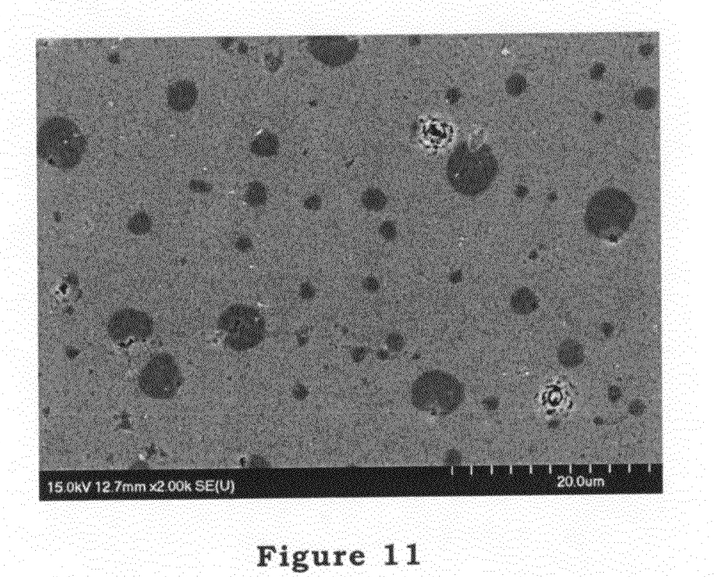
FIG. 11 shows the top view for the patterns of the fourth embodiment by the scanning electron microscope.
Figure 12:
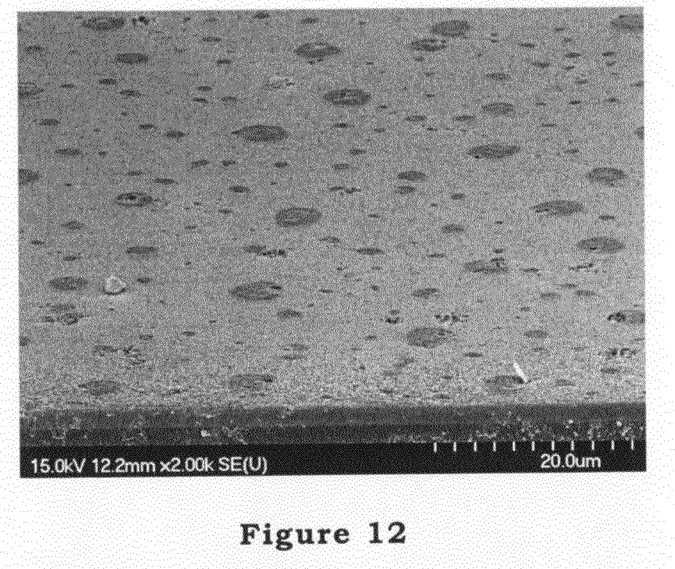
FIG. 12 shows the oblique view for the patterns of the fourth embodiment by the scanning electron microscope.
Figure 13:
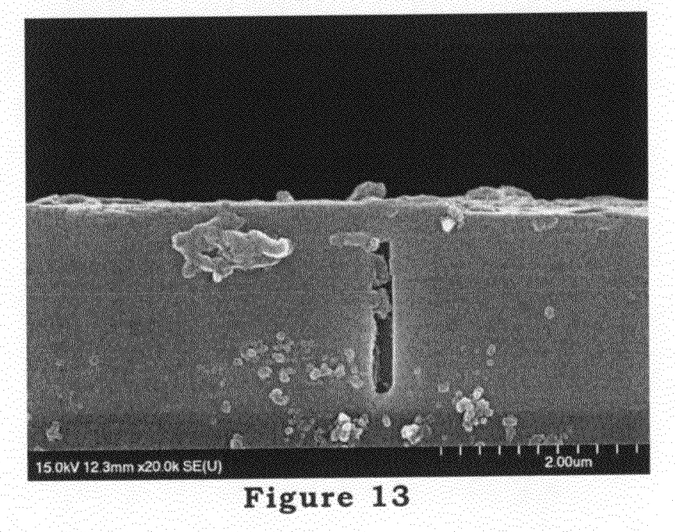
FIG. 13 shows the side view for the patterns of the fourth embodiment by the scanning electron microscope.

As shown in FIG. 11, FIG. 12, and FIG. 13, the top view, the oblique view, and the side view for the patterns of the fourth embodiment are illustrated by the scanning electron microscope (SEM), respectively.

Fifth Embodiment

Heat the GaN template grown by Metal-organic Chemical Vapor Deposition (MOCVD) in the Hydride Vapor Phase Epitaxy (HVPE) reactor. When the temperature reaches about 1100° C. to 1000° C. (1050° C. is preferred and maintained at 1050° C.), introduce 4.9 standard liters per minute (slm) of nitrogen and 1.0 slm of hydrogen into the HVPE reactor. The pressure is maintained at about 150 torr to 50 torr (100 torr is preferred). The reaction time is about 5 minutes to 15 minutes (10 minutes is preferred). When the time is up, stop to supply hydrogen gas and reduce the temperature, the pattern shown in FIG. 14 will be formed on GaN surface.

Figure 14:
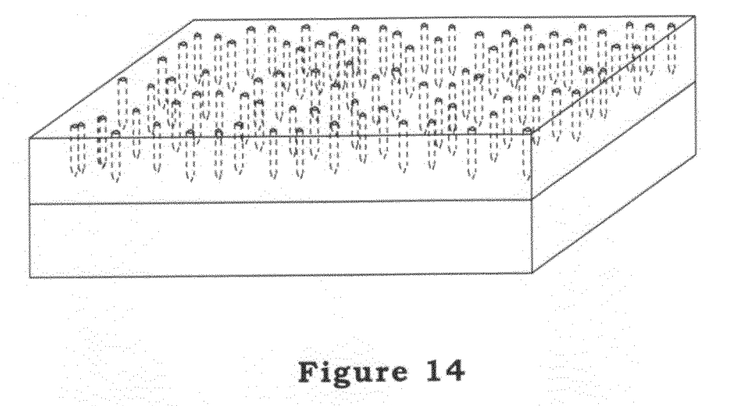
FIG. 14 is a graph illustrating the patterns for the fifth embodiment of the invention.

The reason for the generation of this pattern is, when the pressure is reduced, the nonpolar plane becomes comparatively stable. The deeper etched pits will be appeared at this moment. The shape of pit is similar to the hexagonal lattice of GaN.

Figure 15:
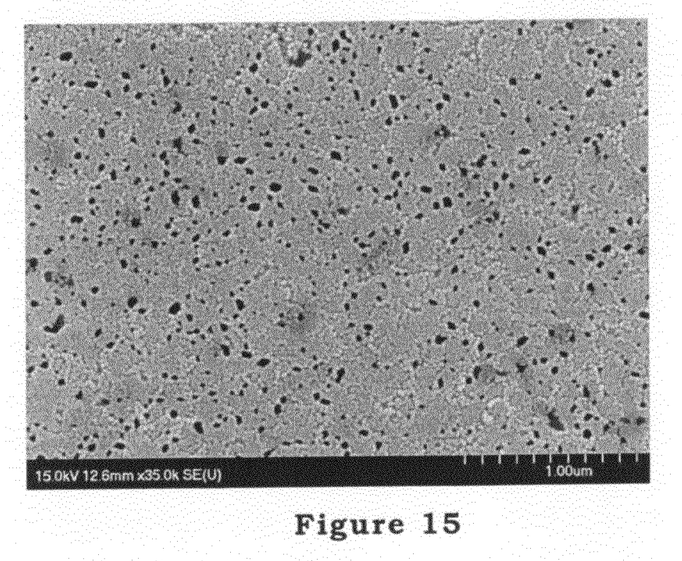
FIG. 15 shows the top view for the patterns of the fifth embodiment by the scanning electron microscope.
Figure 16:
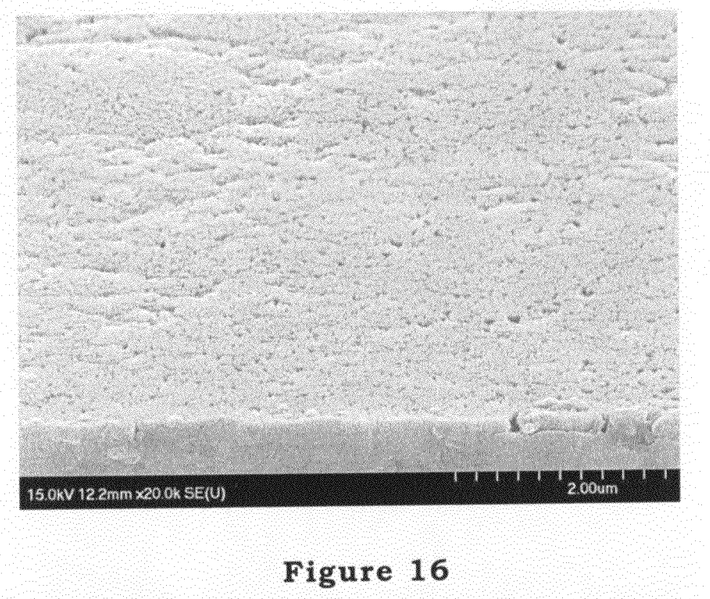
FIG. 16 shows the oblique view for the patterns of the fifth embodiment by the scanning electron microscope.
Figure 17:
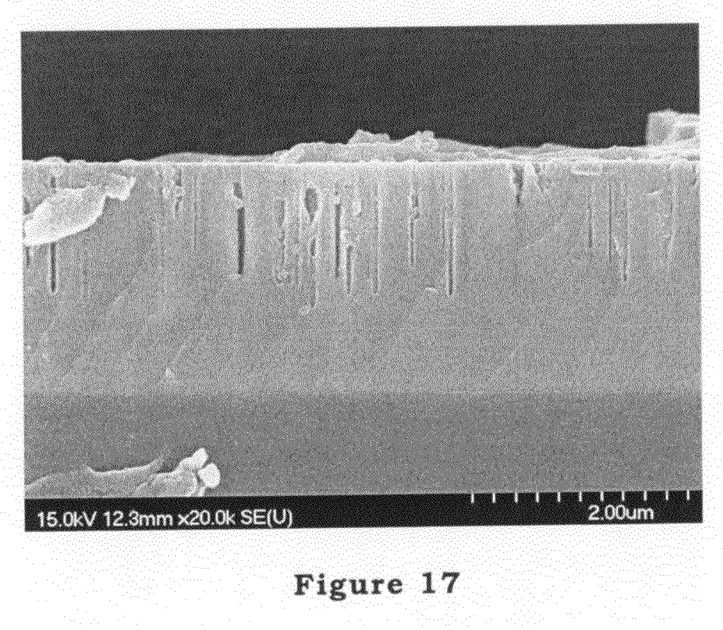
FIG. 17 shows the side view for the patterns of the fifth embodiment by the scanning electron microscope.

As shown in FIG. 15, FIG. 16, and FIG. 17, the top view, the oblique view, and the side view for the patterns of the fifth embodiment are illustrated by the scanning electron microscope (SEM), respectively.

Figure 18:
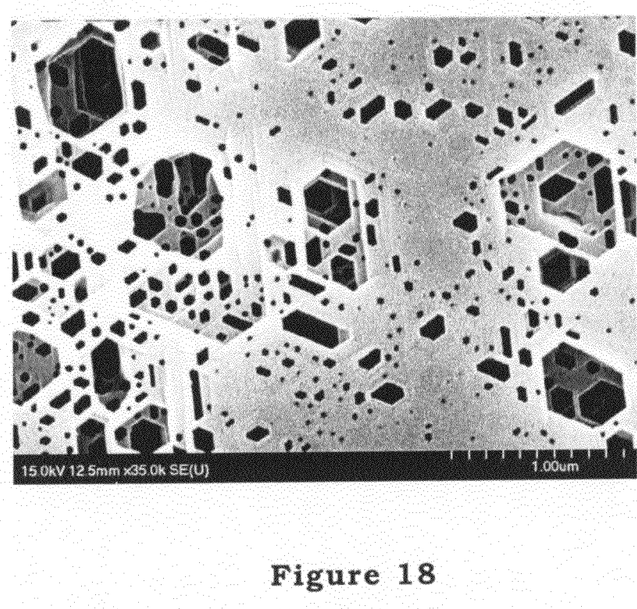
FIG. 18 shows SEM photo for the sample of the fifth embodiment etched by the chemical.

The sample of the fifth embodiment is immersed in a 220° C. acid solution (about 1:3 of phosphoric acid and sulfuric acid) for 20 minutes, and FIG. 18 shows its SEM photo. It is an Etch Pit Density (EPD) technique. The V-shape pit can be etched from the area with dislocation. FIG. 18 shows that the original small pits are etched to big pits, but there is no V-shape pit. So the etching of hydrogen gas is started from the area with dislocation. All areas with dislocation are etched into the column pits.

In the first embodiment to the fifth embodiment, it is found that the hydrogen gas can etch different patterns under different conditions. These etching conditions can be matched each other to produce various types of pattern.

Figure 19:
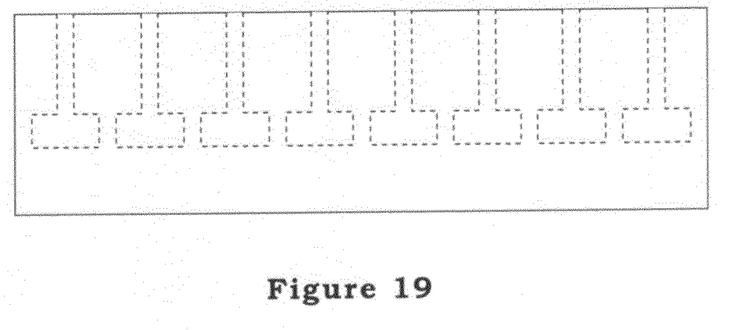
FIG. 19 shows the hybrid patterns etched at low pressure and high temperature first and then etched at the high pressure and the high temperature.

As shown in FIG. 19, when the condition of low pressure and high temperature is used first, the etched down columns will be produced. Then, when the condition of high pressure and high temperature is used, the transverse etching will be produced. The pattern shown in FIG. 19 will be formed.

Figure 20:
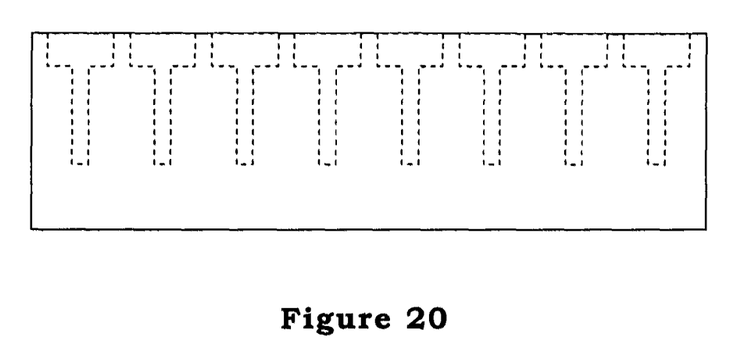
FIG. 20 shows the hybrid patterns etched at the high pressure and the high temperature first and then etched at low pressure and high temperature.

As shown in FIG. 20, when the condition of high pressure and high temperature is used first, the wider columns will be produced. Then, when the condition of low pressure and high temperature is used, the deeper pit will be produced. The pattern shown in FIG. 20 will be formed.

Figure 21:
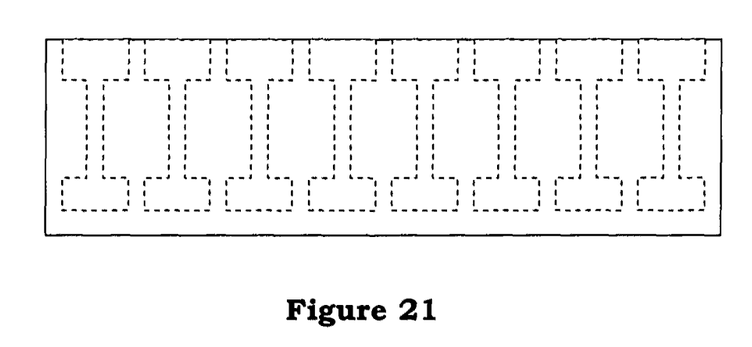
FIG. 21 shows the hybrid patterns etched at high pressure and high temperature first then followed by the low pressure and the high temperature and finally etched at the high pressure and the high temperature.

As shown in FIG. 21, the different hybrid conditions can produce a plurality of patterns. For example, when the condition of high pressure and high temperature is used first, then the condition of low pressure and high temperature is used, and finally the condition of high pressure and high temperature is used, the pattern shown in FIG. 21 will be formed.

In the first embodiment to the fifth embodiment, excepting the hydrogen gas being used as the etching gas, other gases can also be used, such the halogen gases of fluorine ($F_2$), chlorine ($Cl_2$), bromine ($Br_2$), and iodine ($I_2$), or the hydrogen halide gas of hydrogen fluoride (HF), hydrogen chloride (HCl), hydrogen bromide (HBr), and hydrogen iodide (HI), or the halide gases, such as boron trichloride. The pattern with different feature can be produced from the different etching gas.

Thus, the invention can be suitable for various kinds of high-temperature furnace tube with the introduction of gas, such as the high-temperature furnace tube used in Chemical Vapor Deposition (CVD), Metal-organic Chemical Vapor Deposition (MOCVD), and Hydride Vapor Phase Epitaxy (HVPE) etc. The group III nitride semiconductor can be produced on the sapphire substrate, silicon carbide (SiC) substrate or silicon (Si) substrate by MOCVD or other processes, in order to form the template or the free-standing nitride semiconductor substrate. The group III nitride semiconductor bulk made by other method also can be used as the group III nitride semiconductor in the invention.

The invention can use the gas (such as hydrogen) to etch the group III nitride semiconductor layer in a single machine. It even can produce the patterned nitride semiconductor structure on the nitride semiconductor surface directly. The above-mentioned machine can be the general epitaxy machine, such as MOCVD machine or HVPE machine etc. The epitaxy can be carried out the machine directly, thus the manufacturing cost can be reduced in the simple process.

The group III nitride semiconductor of the invention can be applied to the photoelectric semiconductor and the electronic elements mainly. The invention produces various patterns on the surface by using gases with ability to etch the group III nitride semiconductor in the certain conditions.

Under the etching condition of the invention, the etching gas will not carry out the whole etching. It is begun from the certain area, so that the nitride semiconductor surface is etched to form the partially etched area on the pattern. The shape of pattern can be adjusted by the etching condition. For example, the hydrogen gas may produce shallower pit with strong contour at the side and the back direction at the high temperature and the high pressure. It may produce deeper pit at the high temperature and the low pressure. Different hybrid conditions can produce a plurality of patterns. These patterns will make the group III nitride semiconductor to have better quality, such as lower threading-dislocation density and less stress accumulation. As for the manufacturing of group III nitride semiconductor substrate, the thick group III nitride semiconductor film is grown on the heterogeneous substrate (such as sapphire, silicon carbide or lithium aluminate) first, then the thick group III nitride semiconductor film is separated from the substrate by laser or chemical method. The etching method of the invention can weaken the interface between nitride semiconductor and the substrate, and produce the effect of self separation. The method of the invention can achieve the effect of other complicated technology (such as ELOG), thus it will be helpful for the manufacturing of group III nitride semiconductor components.

The invention discloses a treating method to produce various patterns on the surface by using gases with ability to etch the group III nitride semiconductor in certain conditions. The selective etching makes some specific patterns on the group III nitride semiconductor surface, and different forms of the patterns can be controlled by the etching conditions.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for treating GaN semiconductor, comprising:
Conducting 3.95 slm of nitrogen and 1.95 slm of hydrogen etching gas on a GaN layer for about 5 minutes to 15 minutes to form a specific pattern on the GaN formed by Metal-organic Chemical Vapor Deposition (MOCVD), under about 1100° C. to 1000° C. and about 750 torrs to 650 torrs.

2. The method according to claim 1, wherein the specific etching gas is selected from the group consisting of hydrogen gas, halogen gas, hydrogen halide gas, and halide gas.

3. A method for treating GaN semiconductor, comprising:
conducting a 3.95 slm of nitrogen and 1.95 slm of hydrogen etching gas on a GaN layer for about 5 minutes to 15 minutes to form a specific pattern on the GaN formed by Metal-organic Chemical Vapor Deposition (MOCVD), under about 1150° C. to 1050° C. and about 750 torrs to 650 torrs.

4. The method according to claim 3, wherein the specific etching gas is selected from the group consisting of hydrogen gas, halogen gas, hydrogen halide gas, and halide gas.

5. A method for treating GaN semiconductor, comprising:
conducting a 5.9 slm of nitrogen and 1.95 slm of hydrogen etching gas on a free-standing GaN substrate layer for about 25 minutes to 35 minutes to form a specific pattern on the GaN formed by Metal-organic Chemical Vapor Deposition (MOCVD), under about 1150° C. to 1050° C. and about 750 torrs to 650 torrs.

6. The method according to claim 5, wherein the specific etching gas is selected from the group consisting of hydrogen gas, halogen gas, hydrogen halide gas, and halide gas.

7. A method for treating GaN semiconductor, comprising:
conducting a 4.9 slm of nitrogen and 1.0 slm of hydrogen etching gas on a GaN layer for about 5 minutes to 15 minutes to form a specific pattern on the GaN formed by Metal-organic Chemical Vapor Deposition (MOCVD), under about 1100° C. to 1000° C. and about 450 torrs to 350 torrs.

8. The method according to claim 7, wherein the specific etching gas is selected from the group consisting of hydrogen gas, halogen gas, hydrogen halide gas, and halide gas.

9. A method for treating GaN semiconductor, comprising:
conducting a 4.9 slm of nitrogen and 1.0 slm of hydrogen etching gas on a GaN layer for about 5 minutes to 15 minutes to form a specific pattern on the GaN formed by Metal-organic Chemical Vapor Deposition (MOCVD), under about 1100° C. to 1000° C. and about 150 torrs to 50 torrs.

10. The method according to claim 9, wherein the specific etching gas is selected from the group consisting of hydrogen gas, halogen gas, hydrogen halide gas, and halide gas.

* * * * *